United States Patent Office 3,697,319
Patented Oct. 10, 1972

3,697,319

METHOD OF METALLIZING AN ELECTRICALLY INSULATING SURFACE

Nathan Feldstein, Kendall Park, N.J., assignor to RCA Corporation

No Drawing. Filed Dec. 9, 1970, Ser. No. 96,661
Int. Cl. B41m *3/08;* B44d *1/14*
U.S. Cl. 117—212 6 Claims

ABSTRACT OF THE DISCLOSURE

A layer of a resinous adhesive having a metal formate salt dispersed therein is applied to the insulating surface. The layer is then heated to decompose the metal formate salt and to produce decomposition products of the metal of the salt and gases, which form micropores in the layer at the surface. The surface of the layer is then electrolessly plated with a metal for which the metal of the formate salt is a catalyst.

BACKGROUND OF THE INVENTION

This invention relates to a method of metallizing an electrically insulating surface; and, more particularly, to a method of preparing an electrically insulating substrate to receive a plating metal from an electroless plating bath. The novel method is particularly useful in the fabrication of printed circuits and hybrid electronic circuits on electrically insulating substrates.

In the manufacture of printed circuitry and hybrid electronic circuits, it is often desirable to plate a metal, as part of an electrical circuit, on the surface of an electrically insulating substrate. It has been proposed to prepare the substrate by applying thereto a resinous adhesive, having dispersed therein a catalyst, as one condition for the reception of the metal from the electroless plating bath. Cuprous oxide has been incorporated in the resinous adhesive, but cuprous oxide has to be activated with an acid to convert at least a portion of it to (catalytic) copper. Another condition for the recepton of the desired plating metal is a roughened or micropore formation on the surface of the resinous adhesive to which the plated metal can adhere satisfactorily. In the prior-art methods, these micropores were generally produced by physical abrasion or by incorporating a filler material in the resinous adhesive which was leached out to provide the micropores.

While the aforementioned methods of providing a catalytic material and micropores in a resinous adhesive are suitable for many applications, they require additional operations compared to the novel method.

SUMMARY OF THE INVENTION

The novel method of metallizing an electrically insulating surface comprises applying, or adhering, a layer of a resinous adhesive, including a metal formate salt dispersed therein, to the surface; heating the layer to decompose the salt; and plating the surface of the layer with a metal for which the metal of the salt is a catalyst.

In a preferred embodiment of the novel method, the metal formate salt comprises copper formate. Other embodiments of the novel method comprise employing resinous adhesives, including a metal formate salt of nickel, cobalt, silver, or mixtures thereof. The heating operation produces products of decomposition of the salt that comprise the metal of the salt and gases which escape into the ambient, leaving micropores in the layer at the surface thereof to provide a good adhesive surface for a plating metal.

The novel method, employing a decomposable metal formate salt, has advantages over the prior-art preparatory methods in that the single operation of heating the resinous adhesive produces as decomposition products, both a metal catalyst and micropores in the layer of resinous adhesive. Thus, the aforementioned acid treatment and leaching or abrasion of the resinous adhesive of some prior-art methods are eliminated. Also, the heating operation for the production of the aforementioned decomposition products in the novel method may be incorporated in the curing stage of the resinous adhesive. No products of decomposition are formed in the novel method that are detrimental to the subsequent electroless plating or to the use of the plated metal in an electronic circuit.

DESCRIPTION OF THE PREFERRED EMBODIMENT

The novel method of metallizing an electrically insulating surface, such as of substrates of alumina, ceramic, glass, resin impregnated laminates of paper, cloth, or "Fiberglas," phenolic boards, or the like, comprises applying a thin layer of a resinous adhesive, having dispersed therein a decomposable metal formate salt, to the cleaned surface of the substrate. The layer of resinous adhesive, which is preferably thermosetting, is heated not only to cure the adhesive but also to decompose the metal formate salt into desirable decomposition products. One of the decomposition products should be the metal of the salt, and this metal should be a catalyst for the subsequent plating metal, as from an electroless plating bath. Other desirable products of decomposition of the metal formate salt are gases, which may include water vapor, that escape into the ambient and leave the layer of cured resinous adhesive with micropores at the surface to which the subsequently plated metal can easily and tenaciously adhere.

Suitable metal formate salts for inclusion into the layer of the resinous adhesive are copper formate, nickel formate, cobalt formate, and silver formate. These metal formate salts decompose as follows under the temperatures indicated:

$$Cu(HCOO)_2 \xrightarrow{180^\circ C} Cu + CO\uparrow + CO_2\uparrow + H_2O_{(vapor)}\uparrow$$

$$Ni(HCOO)_2 \xrightarrow{300^\circ C} \underset{(90\%)}{Ni} + CO\uparrow + CO_2\uparrow + H_2\uparrow + \underset{(10\%)}{Ni_2O}$$

$$Co(CHOO)_2 \xrightarrow{295^\circ C} \underset{(50\%)}{Co} + CO\uparrow + CO_2\uparrow + H_2\uparrow + \underset{(59\%)}{CoO}$$

$$2AgHCOO \xrightarrow{175^\circ C} 2Ag + 2CO_2\uparrow + H_2\uparrow$$

In each of the illustrated thermal decompositions of the metal formate salts, it is noted that the metal of the metal formate salt is produced along with gases and, in some cases water vapor or an oxide of the metal. These gases and water vapor escape into the ambient through the layer of the resinous adhesive and produce micropores in the layer which extends to the surface of the layer during this process. Thus, the single operation of heating the layer of the resinous adhesive, including the metal formate salt dispersed therein, produces both a catalytic agent and micropores to receive the subsequent metallizing from a plating bath. The metal oxides formed as products of decomposition of the nickel and cobalt formate salts do not interfer with the subsequent metal plating operation.

Suitable resinous adhesives as vehicles for the aforementioned metal formate salts are preferably combinations of thermosetting and flexible adhesive resins. Some typical thermosetting resins are oil soluble phenolic-type resins, such as fusible copolymers of phenol, resorcinol, cresol, or xylenol modified with an aldehyde. Modified epoxy and polyester resins, well known in the art, may also be used. The polyester resins are ordinarily dissolved in styrene monomer and cross-linked by reaction with the styrene.

Some typical flexible adhesive resins are the polyvinyl acetals, polyvinyl alcohols, polyvinyl acetates, chlorinated rubber, and butadiene acrylonitrile copolymers.

The resins of the type described may have appended thereto polar groups, such as nitrile, epoxide, acetal, and hydroxyl groups. The modifying resins copolymerize with and plasticize the thermosetting resins and impart good adhesive characteristics thereto through the action of the polar groups. The thermosetting resin portion of the combined resinous adhesive is usually required to afford resistance to heat upon subsequent soldering, and also to protect against decomposition when subjected to the electroless plating baths. An admixture of adhesive resins, such as those disclosed, provide an especially suitable composition for carrying the metal formate salts and for adhesively binding them to the substrate.

Polyvinyl acetal modified phenolic resins and modified epoxy resins are suitable adhesive resins for mixing with both copper formate and silver formate salts as follows:

FORMULA 1

| | Percent, by weight |
|---|---|
| Oil soluble, thermosetting phenolic resin (solid) | 18 |
| Polyvinyl butyral resin having a specific gravity of 1.12 | 2 |
| Ethanol or toluene | 70 |
| Copper formate | 10 |

The ingredients of Formula 1 are mixed in a Waring Blendor until a homogeneous mixture is formed.

FORMULA 2

| | Percent, by weight |
|---|---|
| Oil soluble, thermosetting phenolic resin (solid) | 18 |
| Polyvinyl butyral resin having a specific gravity of 1.12 | 2 |
| Ethanol or toluene | 70 |
| Silver formate | 10 |

The ingredients of Formula 2 are mixed as for Formula 1.

FORMULA 3

| | Percent, by weight |
|---|---|
| Epoxy resin (bisphenol A type) having an epoxy assay of 150–500 | 45 |
| Polyamide resin with an amine equivalent of 20–70 | 45 |
| Copper formate | 10 |

The ingredients of Formula 3 are mixed to form a homogeneous mixture.

FORMULA 4

| | Percent, by weight |
|---|---|
| Epoxy resin (bisphenol A type) having an epoxy resin assay of 150–500 | 45 |
| Polyamide resin with an amine equivalent of 20–70 | 45 |
| Silver formate | 10 |

The ingredients of Formula 4 are mixed to form a homogeneous mixture.

Adhesive resins of the polyaromatic compounds are suitable for incorporating nickel and cobalt formates because they can withstand high processing temperatures. For example, suitable homogeneous mixtures of adhesive resins and nickel or cobalt formate are:

FORMULA 5

| | Percent, by weight |
|---|---|
| Polybenzimidazole adhesive (PBI) | 90 |
| Nickel formate | 10 |

FORMULA 6

| | Percent, by weight |
|---|---|
| Polybenzimidazole adhesive (PBI) | 90 |
| Cobalt formate | 10 |

Polyimide adhesives, reaction products of a diamine and a dianhydride, may also be used to incorporate nickel and/or cobalt formate salts in homogeneous adhesive mixtures, as for example:

FORMULA 7

| | Percent, by weight |
|---|---|
| Polyimide adhesive | 90 |
| Nickel formate | 10 |

FORMULA 8

| | Percent, by weight |
|---|---|
| Polyimide adhesive | 90 |
| Cobalt formate | 10 |

The quantities in the foregoing formulas are not critical. The metal formate salts may vary from about 5% to about 30%, by weight, of the mixture. Also, other suitable adhesive resins may be used, such as disclosed, for example, in the book "Aspects of Adhesion," edited by D. J. Alner, and published by CRC Press, a division of the Chemical Rubber Co., Cleveland, Ohio.

A thin layer, ranging in thickness of between 0.1 and 3.0 mils of any of the aforementioned formulas of mixtures of the resinous adhesives and the metal formate salts, is applied to a surface of an electrically insulating substrate to be metallized by any suitable means, such as by silk-screening, by dipping the substrate into the resinous adhesive or by applying the resinous adhesive to the surface of the substrate with a doctor blade. The layer of the resinous adhesive may be applied to the surface of the substrate in the form of any desired pattern. For example, the layer may comprise a network of lines that will be metallized subsequently to form electrical conductors. The layer may also completely cover the entire surface of the substrate to provide a metal coating that may be subsequently etched to form a desired pattern.

The layer of resinous adhesive is dried initially at a relatively low temperature, about 140° C. for about 10 minutes, to drive off any solvents therein. The layer is heated subsequently to cure it and to cause the decomposition of the metal formulate salt dispersed throughout the layer. The temperature of heating the layer is at least high enough to cause the aforementioned decomposition products and the heating is carried on for a period sufficient to cause the curing of the resinous adhesive. The time of heating is usually between 5 and 60 minutes, depending on the resinous adhesive used. After the heating operation, the layer of the cured resinous adhesive contains micropores and the reduced metal of the metal salt which serves as a catalyst for the deposition of metal from an electroless plating bath. If, for example, the metal formate salt in the resinous adhesive is copper, and it is desired to coat the substrate with copper, the following electroless plating bath can be used:

ELECTROLESS COPPER BATH

| | | |
|---|---|---|
| $CuSO_4 \cdot 5H_2O$ | g./l. | 7.5 |
| (EDTA) ethylene diamine tetracetic acid | | |
| Sodium salt | g./l. | 15 |
| NaOH | g./l. | 20 |
| NaCN | g./l. | 0.1 |
| Formaldehyde | ml./l. | 40 |

A suitable electroless cobalt plating bath for metallizing a layer of resinous adhesive that includes cobalt as a product of decomposition therein is:

ELECTROLESS COBALT BATH

| | | |
|---|---|---|
| Cobalt chloride, hexahydrate | g./l. | 30 |
| Sodium citrate, pentahydrate | g./l. | 35 |
| Ammonium chloride | g./l. | 50 |
| Sodium hypophosphite | g./l. | 20 |
| pH (adjusted with $NH_4OH$) | | 9–10 |
| Temperature | ° C. | 91–96 |
| Rate of deposition | mil/hour | 0.6 |

Either copper, nickel, or cobalt may be plated on a layer of a resinous adhesive, including silver as a product of thermal decomposition, from the respective aforementioned electroless metal plating baths. It is within the contemplation of the novel method to plate with any metal and from any electroless metal plating bath wherein copper, nickel, cobalt, or silver are catalysts for the plating metal. It is also within the contemplation of the novel method to include more than one of the aforementioned metal formate salts in a layer of resinous adhesive to provide a catalyst of more than one metal when the layer is heated to decompose the metal formate salts.

I claim:

1. A method of metallizing an electrically insulating surface comprising the steps of:

applying a layer of a curable resinous adhesive to said surface, said resinous adhesive having dispersed throughout said layer a metal formate salt, the metal of said formate salt being a catalyst for the reception of a plating metal;

heating said layer to a temperature at which said resinous adhesive cures and at which said metal formate salt decomposes and products products of decomposition comprising the metal of said salt and a gas which escapes into the ambient, whereby to cure said resinous adhesive and to leave micropores in said layer at the surface thereof; and, electrolessly plating said plating metal on said surface of said layer.

2. A method of metallizing an electrically insulating surface as described in claim 1, wherein said metal formate salt is copper formate; and the step of heating said layer comprises raising its temperature to at least 180° C. to produce decomposition products comprising copper, carbon monoxide, and carbon dioxide.

3. A method of metallizing an electrically insulating surface as described in claim 1, wherein said metal formate salt is nickel formate; and, the step of heating said layer comprises raising its temperature to at least 300° C. to produce decomposition products comprising nickel, carbon monoxide, carbon dioxide, and hydrogen.

4. A method of metallizing an electrically insulating surfaces as described in claim 1, wherein said metal formate salt is cobalt formate; and, the step of heating said layer comprises raising its temperature to at least 295° C. to produce decomposition products comprising cobalt, carbon monoxide, carbon dioxide, and hydrogen.

5. A method of metallizing an electrically insulating surface as described in claim 1, wherein said metal formate salt is silver formate; and, the step of heating said layer comprises raising its temperature to at least 175° C. to produce the decomposition products of silver, carbon dioxide, and hydrogen.

6. A method of metallizing an electrically insulating surface comprising the steps of:

adhering a layer of a curable resinous adhesive to said surface in a desired pattern, said layer having a metal formate salt dispersed throughout said layer, said salt being one selected from the group consisting of copper formate, nickel formate, cobalt formate, silver formate, and mixtures thereof;

heating said layer to a temperature at which said resinous adhesive cures and at which said salt decomposes and maintaining said temperature for a time sufficient to produce products of decomposition comprising the metal of said salt and gases, said gases escaping into the ambient and forming micropores in said layer at the surface thereof; and, electrolessly plating the surface of said layer with a metal from a metal plating bath for which said metal of said salt is a catalyst.

References Cited

UNITED STATES PATENTS

| | | | |
|---|---|---|---|
| 3,523,824 | 8/1970 | Powers et al. ------ | 117—217 X |
| 3,451,813 | 6/1969 | Kinney et al. ------ | 117—212 X |
| 3,391,455 | 7/1968 | Hirohata et al. ---- | 117—217 X |
| 3,060,062 | 10/1962 | Katz et al. ---------- | 117—212 |
| 3,146,125 | 8/1964 | Schneble, Jr., et al. --- | 117—212 |
| 3,226,256 | 12/1965 | Schneble, Jr., et al. --- | 117—212 |
| 3,259,559 | 7/1966 | Schneble, Jr., et al. -- | 117—217 X |
| 3,385,732 | 5/1968 | Curran ------------- | 117—212 |
| 3,506,482 | 4/1970 | Hirohata et al. ---- | 117—217 X |

ALFRED L. LEAVITT, Primary Examiner

J. R. BATTEN, Jr., Assistant Examiner

U.S. Cl. X.R.

117—71 R, 217, 218

UNITED STATES PATENT OFFICE
CERTIFICATE OF CORRECTION

Patent No. 3,697,319 Dated October 10, 1972

Inventor(s) Nathan Feldstein

It is certified that error appears in the above-identified patent and that said Letters Patent are hereby corrected as shown below:

Page 1, line 46, under CoO, change "(59%)" to -- (50%) --.

Signed and sealed this 20th day of February 1973.

(SEAL)
Attest:

EDWARD M.FLETCHER,JR.
Attesting Officer

ROBERT GOTTSCHALK
Commissioner of Patents

FORM PO-1050 (10-69)
3530 6|72

USCOMM-DC 60376-P69
☆ U.S. GOVERNMENT PRINTING OFFICE 1969 O—366-334